(12) United States Patent
Kim et al.

(10) Patent No.: US 11,606,870 B2
(45) Date of Patent: Mar. 14, 2023

(54) CHARGER HAVING HEAT INSULATING STRUCTURE

(71) Applicant: SOLUM Co., Ltd., Yongin-si (KR)

(72) Inventors: HyunSu Kim, Hwaseong-si (KR); JunKyu Lee, Yongin-si (KR)

(73) Assignee: SOLUM Co., Ltd., Yongin-si (KR)

( * ) Notice: Subject to any disclaimer, the term of this patent is extended or adjusted under 35 U.S.C. 154(b) by 499 days.

(21) Appl. No.: 16/773,387

(22) Filed: Jan. 27, 2020

(65) Prior Publication Data

US 2021/0007232 A1    Jan. 7, 2021

(30) Foreign Application Priority Data

Jul. 4, 2019 (KR) .......................... 10-2019-0080499

(51) Int. Cl.
| | | |
|---|---|---|
| *H05K 5/02* | (2006.01) | |
| *H02J 7/00* | (2006.01) | |
| *H05K 7/14* | (2006.01) | |
| *H01R 31/06* | (2006.01) | |
| *H05K 5/00* | (2006.01) | |

(Continued)

(52) U.S. Cl.
CPC ......... *H05K 5/0213* (2013.01); *H01R 31/065* (2013.01); *H02J 7/0042* (2013.01); *H05K 1/181* (2013.01); *H05K 5/0026* (2013.01); *H05K 5/03* (2013.01); *H05K 7/1427* (2013.01)

(58) Field of Classification Search
CPC ........ H05K 5/0213; H05K 5/03; H05K 1/181; H02J 7/0042
See application file for complete search history.

(56) References Cited

U.S. PATENT DOCUMENTS

| | | | | |
|---|---|---|---|---|
| 5,436,803 A | * | 7/1995 | Annis ................ | H05K 9/0043 174/382 |
| 5,597,979 A | * | 1/1997 | Courtney ............ | H05K 9/0043 174/378 |

(Continued)

FOREIGN PATENT DOCUMENTS

| | | |
|---|---|---|
| JP | 2015-8567 A | 1/2015 |
| KR | 101641616 B1 | 7/2016 |
| KR | 1020170060714 A | 6/2017 |

OTHER PUBLICATIONS

Communication of Notice of Allowance dated May 18, 2021, issued by the Korean Intellectual Property Office in Korean Application No. 10-2019-0080499.

(Continued)

*Primary Examiner* — Rockshana D Chowdhury
*Assistant Examiner* — Douglas R Burtner
(74) *Attorney, Agent, or Firm* — Sughrue Mion, PLLC

(57) ABSTRACT

A charger having a heat insulating structure is provided. The charger includes: a case having one side at which an opening is formed and the other side to which a terminal portion is coupled; a printed circuit board having a front surface and a rear surface on which electronic components are mounted, respectively, and inserted into the case through the opening of the case; a heat insulating member disposed inside the case and formed to cover the electronic components mounted on the rear surface of the printed circuit board to block heat generated from the electronic components of the printed circuit board from being transferred to an entire surface of the case; and a cover closing the opening of the case.

11 Claims, 8 Drawing Sheets

(51) Int. Cl.
*H05K 1/18* (2006.01)
*H05K 5/03* (2006.01)

(56) References Cited

U.S. PATENT DOCUMENTS

| | | | | |
|---|---|---|---|---|
| 9,414,480 | B2* | 8/2016 | Lu | H05K 7/20863 |
| 9,655,288 | B2* | 5/2017 | You | H05K 7/1432 |
| 9,728,984 | B2 | 8/2017 | Ogura | |
| 10,021,808 | B1* | 7/2018 | Nyland | H04M 1/0202 |
| 10,446,890 | B2* | 10/2019 | Yoshida | H01M 10/637 |
| 10,468,895 | B2* | 11/2019 | Noh | H02J 7/0045 |
| 2009/0289596 | A1* | 11/2009 | McGinley | H01R 31/065 |
| | | | | 320/111 |
| 2014/0375269 | A1 | 12/2014 | Ogura | |
| 2016/0352119 | A1* | 12/2016 | Noh | H02J 7/0045 |
| 2017/0127560 | A1* | 5/2017 | You | H05K 5/03 |
| 2017/0317533 | A1* | 11/2017 | Byrne | H04B 5/0037 |
| 2018/0345025 | A1* | 12/2018 | Stinauer | H02J 7/025 |
| 2018/0366697 | A1* | 12/2018 | Elfering | H01M 50/509 |
| 2019/0097202 | A1* | 3/2019 | Morone | H01M 50/583 |
| 2022/0085427 | A1* | 3/2022 | Tajima | H01M 10/486 |

OTHER PUBLICATIONS

Communication Decision of Rejection dated Mar. 16, 2021, issued by the Korean Intellectual Property Office in Korean Application No. 10-2019-0080499.
Communication dated Dec. 10, 2020 issued by the Korean Patent Office in application No. 10-2019-0080499.

* cited by examiner

CHARGER HAVING HEAT INSULATING STRUCTURE

CROSS-REFERENCE TO RELATED APPLICATION(S)

This application is based on and claims priority under 35 U.S.C. § 119 to Korean Patent Application No. 10-2019-0080499, filed on Jul. 4, 2019, in the Korean Intellectual Property Office, the disclosure of which is incorporated by reference herein in its entirety.

BACKGROUND OF THE INVENTION

Field

The disclosure relates to a charger for a mobile device, and more particularly, to a charger having a heat insulating structure capable of preventing a surface temperature from excessively rising.

Description of the Prior Art

Recently, in accordance with an increase in power consumption in a mobile device due to improvement of specifications of the mobile device, a capacity of a battery, which is a power source, has increased. As the capacity of the battery increases, an output of a charger for charging the battery has continuously increased. Particularly, as a charger of a premium model, a charger having an output up to about 60 Watt has been released on the market, and such a charger has been continuously developed.

Meanwhile, due to characteristics of the mobile device, a demand for a charger capable of a high output and having a compact size has increased.

However, as the output of the charger increases, heat generated inside the charger increases, and a surface temperature of an outer case of the charger thus rises. For this reason, when a user touches the charger at the time of charging the mobile device for a long time, the uses feels uncomfortable or suffers even a low temperature burn because the surface temperature of the case of the charger is high.

Due to such a heat generation problem of the charger, it was difficult to effectively dissipate heat generated inside the charger when the charger is compactly manufactured.

SUMMARY OF THE INVENTION

The disclosure provides a charger capable of being formed in a compact and slim size and solving a problem that a user suffers a low temperature burn at the time of touching the charger by performing heat insulation processing so that a temperature of a case of the charger does not rise due to heat generation inside the charger.

According to an embodiment of the disclosure, a charger includes: a case having one side at which an opening is formed and the other side to which a terminal portion is coupled; a printed circuit board having a front surface and a rear surface on which electronic components are mounted, respectively, and inserted into the case through the opening of the case; a heat insulating member disposed inside the case and formed to cover the electronic components mounted on the rear surface of the printed circuit board to block heat generated from the electronic components of the printed circuit board from being transferred to an entire surface of the case; and a cover closing the opening of the case.

The heat insulating member may be formed integrally with the case.

The case may include a pair of slots disposed in inner side surfaces thereof, and the pair of slots may have grooves in which both ends of the printed circuit board are provided.

The heat insulating member may be disposed to be spaced apart from the electronic components disposed on the rear surface of the printed circuit board.

The heat insulating member may be disposed between the printed circuit board and one side portion of the case to be spaced apart from each of the printed circuit board and the one side portion of the case.

The heat insulating member may be disposed between the printed circuit board and one side portion of the case, and the heat insulating member may include: a central portion; and end portions positioned at both sides of the central portion with the central portion interposed therebetween, the central portion being recessed from the end portions toward the one side portion of the case.

The heat insulating member may be formed of one material, and the heat insulating member may include an insulating material.

The charger may further include an additional heat insulating member disposed inside the case and covering the electronic components mounted on the front surface of the printed circuit board.

The additional heat insulating member may have a length different from that of the heat insulating member.

The additional heat insulating member may be disposed to be spaced apart from the other side portion of the case, such that an air layer is formed between the additional heat insulating member and the other side portion of the case.

The additional heat insulating member may be manufactured separately from the case, and ends of the additional heat insulating member may be coupled to an inner side of the case.

The heat insulating member and the additional heat insulating member may be formed of an insulator.

The heat insulating member and the additional heat insulating member may be composed to be integrally with the cover.

According to the embodiments of the disclosure as described above, the transfer of the heat generated from the electronic components of the printed circuit board disposed inside the charger to the case may be suppressed as much as possible to lower a surface temperature of the charger. Therefore, it is possible to prevent a user from feeling uncomfortable or suffering a low temperature burn due to a hot case when the user handles the charger.

DESCRIPTION OF THE PREFERRED EMBODIMENT

Figure 1:
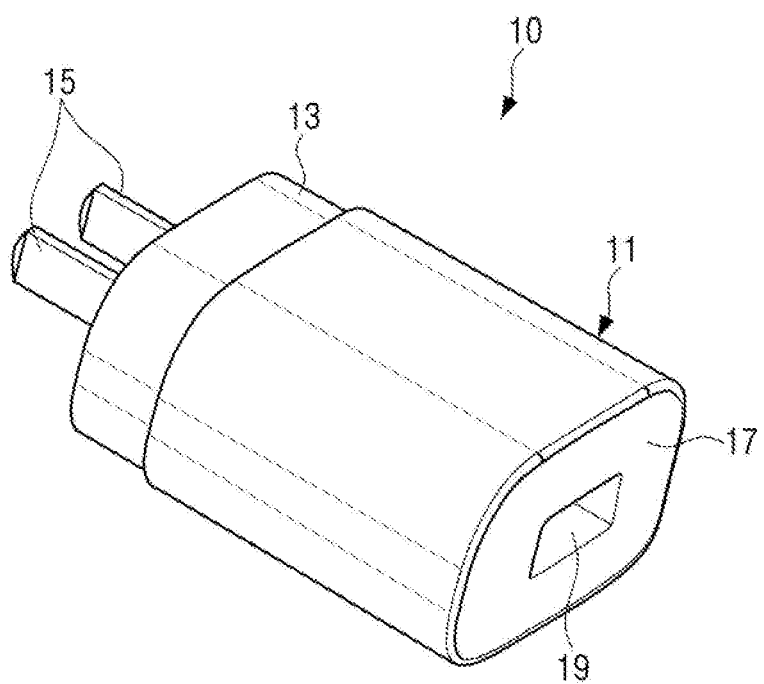
FIG. 1 is a perspective view illustrating a charger according to an embodiment of the disclosure.

Hereinafter, various embodiments will be described in more detail with reference to the accompanying drawings. Embodiments mentioned in the specification may be variously modified. A specific embodiment may be illustrated in the drawings and be described in detail in a detailed description. However, the specific embodiment illustrated in the accompanying drawings is provided only to allow various embodiments to be easily understood. Therefore, it should be understood that the spirit of the disclosure is not limited by the specific embodiment illustrated in the accompanying drawings, and includes all the modifications, equivalents, and substitutions included in the spirit and the scope of the disclosure.

Terms including ordinal numbers such as "first", "second", and the like, may be used to describe various components. However, these components are not limited by these terms. These terms are used only to distinguish one component from another component.

It should be further understood that terms "include" or "have" used in the specification specify the presence of features, numerals, steps, operations, components, parts mentioned in the specification, or combinations thereof, but do not preclude the presence or addition of one or more other features, numerals, steps, operations, components, parts, or combinations thereof. It is to be understood that when one element is referred to as being "connected to" or "coupled to" another element, it may be connected directly to or coupled directly to another element or be connected to or coupled to another element, having the other element intervening therebetween. On the other hand, it should be understood that when one element is referred to as being "connected directly to" or "coupled directly to" another element, it may be connected to or coupled to another element without the other element interposed therebetween.

Further, when it is decided that a detailed description for known functions or configurations related to the disclosure may unnecessarily obscure the gist of the disclosure, the detailed description therefor will be abbreviated or omitted.

Hereinafter, a structure of a charger according to an embodiment of the disclosure will be described with reference to the drawings.

Figure 2:
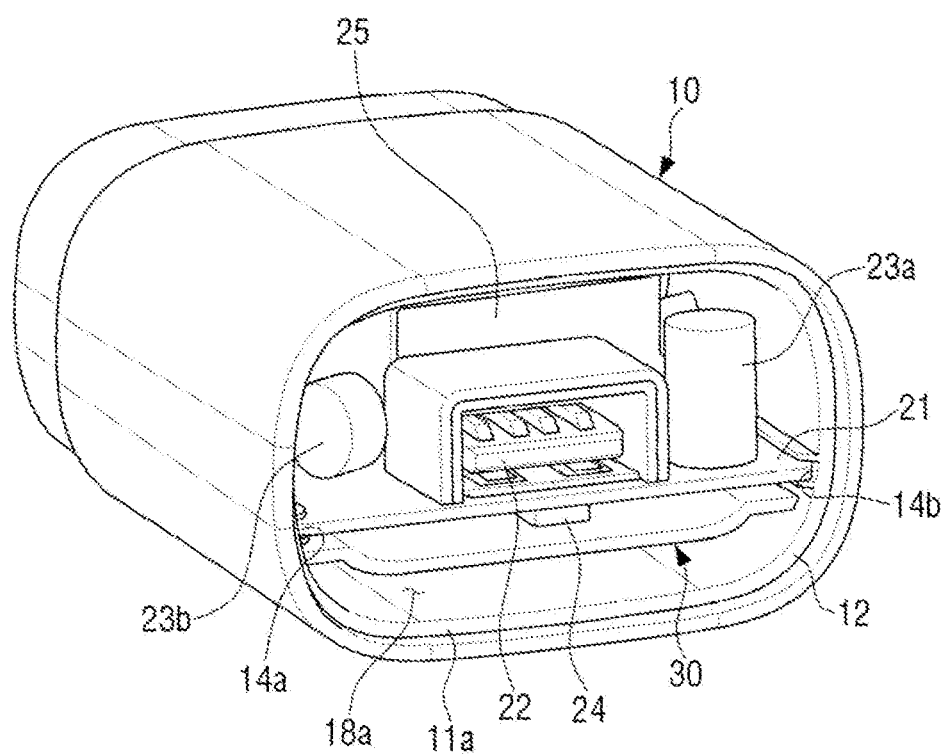
FIG. 2 is a view illustrating the inside of the charger by separating a cover of the charger according to an embodiment of the disclosure.
Figure 3:
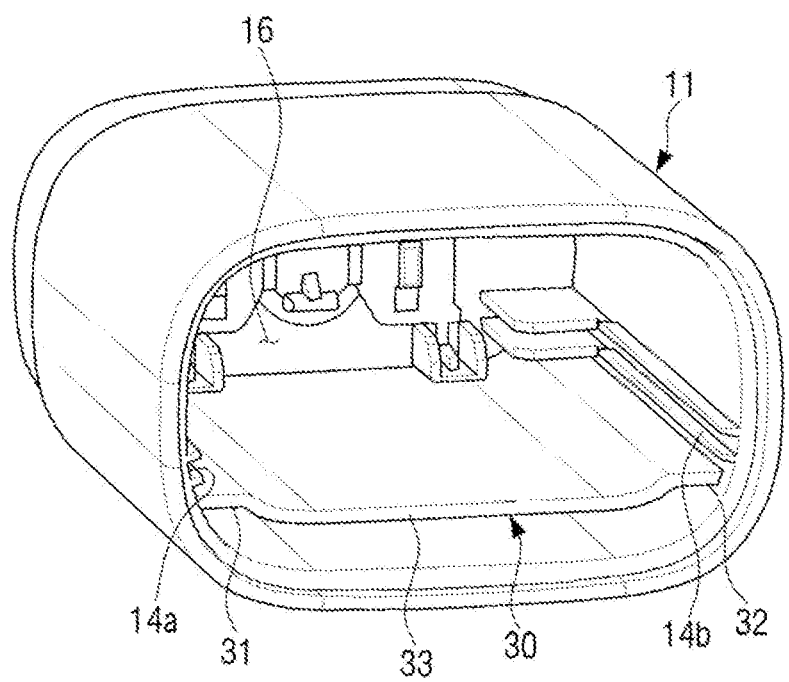
FIG. 3 is a view illustrating a heat insulating structure of the inside of the charger according to an embodiment of the disclosure.

FIG. 1 is a perspective view illustrating a charger according to an embodiment of the disclosure, FIG. 2 is a view illustrating the inside of the charger by separating a cover of the charger according to an embodiment of the disclosure, and FIG. 3 is a view illustrating a heat insulating structure of the inside of the charger according to an embodiment of the disclosure.

Referring to FIGS. 1 and 2, a charger 10 having a heat insulating function according to an embodiment of the disclosure includes a case 11, terminal portions 15, a printed circuit board 21, a cover 17, and a heat insulating member 30.

An opening 12 into which a transformer 25 and the printed circuit board 21 mounted with circuit elements 23a and 23b may be inserted may be formed at one side of the case 11. The case 11 may be provided with a space 16 in which the printed circuit board 21 and the heat insulating member 30 are disposed. The case 11 may be formed of plastic, and may be manufactured by injection-molding the plastic.

An extending portion 13 may be formed on the other side of the case 11. The extending portion 13 may be formed to have a size smaller than that of the case 11 so that it may be inserted into an outlet (not illustrated) of the case 11. In this case, the extending portion 13 may be formed integrally with the case 11 to be stepped from the case 11. Alternatively, the extending portion 13 may be manufactured separately from the case 11 and be coupled to the other side of the case 11 through a bonding or snap coupling structure.

A pair of slots 14a and 14b to which both ends of the printed circuit board 21 are slidably coupled may be formed in inner side surfaces of the case 11 facing each other. Each of the pair of slots 14a and 14b may have a groove with a predetermined length.

The terminal portions 15 are coupled to the case 11, and are inserted into an outlet to allow electricity to be supplied to the charger 10. The terminal portions 15 may also be coupled to a tip of the extending portion 13.

A plurality of terminal portions 15 may be disposed to be spaced apart from each other. The number and sizes of terminal portions 15 may be variously changed. In addition, shapes of the terminal portions 15 and portions at which the terminal portions are disposed on the case may be various, and may be appropriately modified particularly according to specifications defined in each country.

The cover 17 is detachably coupled to the opening 12 of the case 20, and closes the opening 12 of the case 11. A terminal insertion hole 19 in which a terminal of an external cable (not illustrated) is coupled to a socket 22 of the printed circuit board 21 may be formed in the cover 17.

The cover 17 may be manufactured by injection-molding plastic, similar to the case 11. Meanwhile, although not illustrated in the drawings, a heat radiation plate formed of a metal may be disposed on an inner side surface of the cover 17. In this case, heat generated from the circuit elements 23a and 23b or the transformer 25 positioned inside the case 11 during use of the charger 10 may be dissipated to the cover 17 and then radiated to the outside of the charger 10 through the heat radiation plate.

Various electronic components, for example, the circuit elements 23a and 23b, the transformer 25, and the socket 22 to which the terminal of the external cable is electrically connected may be mounted on a front surface of the printed circuit board 21, and a plurality of circuit elements 24 may be mounted on a rear surface of the printed circuit board 21. In this case, the circuit elements 24 mounted on the rear surface of the printed circuit board 21 may have a height and a size smaller than those of the electronic components mounted on the front surface of the printed circuit board 21.

Meanwhile, the external cable electrically connects a mobile device and the charger to each other, a type of the terminal of the external cable may be any one of a universal serial bus (USB) terminal, a micro 5-pin terminal, or a lightning 8-pin terminal, and the socket 22 may be formed in a structure corresponding to the type of the terminal of the external cable.

The printed circuit board 21 converts high voltage electricity to allow a suitable voltage and current to be supplied to a mobile device (not illustrated) to be used.

Referring to FIG. 3, the heat insulating member 30 may be injection-molded integrally with the case 11. In addition, the heat insulating member 30 may be manufactured as a separate component and be coupled to an inner side of the case 11. In this case, both ends of the heat insulating member 30 may be coupled to the pair of slots formed in the case or the heat insulating member 30 may be bonded to the inner side of the case by applying an adhesive to both ends of the heat insulating member. Such a heat insulating member 30 may be formed in a partition wall shape having a predetermined thickness.

Meanwhile, the heat generated from the circuit elements 23a and 23b of the printed circuit board 21 or the transformer 25 is transferred to the rear surface of the printed circuit board 21. Therefore, the heat may be concentrated on one side portion 11a of the case 11 adjacent to the rear surface of the printed circuit board 21.

Therefore, the heat insulating member 30 may cover the entirety of the rear surface of the printed circuit board 21 to block heat generated from components generating heat at the time of being operated among the electronic components mounted on the printed circuit board 21 from being directly transferred to the case 11.

The heat insulating member 30 may be disposed to be spaced apart from the printed circuit board 21 so that it is not in contact with the circuit elements mounted on the rear surface of the printed circuit board 21. In this case, the heat insulating member 30 may have a shape in which a central portion 33 thereof positioned between both end portions 31 and 32 thereof is spaced farther apart from the printed circuit board 21 than the both end portions are. That is, the central portion 33 may have a shape recessed from the both end portions 31 and 32 or a concave shape so that it is more adjacent to the case 11 than the both end portions 31 and 32 are.

In addition, the heat insulating member 30 may be formed of an insulating material so that electrical connection between the heat insulating member 30 and the electronic components formed on the rear surface of the printed circuit board 21 is not generated.

In addition, the heat insulating member 30 may be disposed to be spaced apart from one side portion 11a of the case 11 by a predetermined interval. Therefore, an air layer 18a may be formed between the heat insulating member 30 and one side portion 11a of the case 11.

Such an air layer 18a may block the heat transferred from the heat insulating member 30 to one side portion 11a of the case 11. Therefore, the heat generated in the printed circuit board 21 may be primarily insulated by the heat insulating member 30, and may be secondarily insulated by the air layer 18a.

The charger 10 including the heat insulating member 30 formed to cover the rear surface of the printed circuit board 21 as described above may have a compact size and effectively block the heat generated inside the charger 10 at the time of operating the charger 10 from being radiated to the outside of the charger 10 to fundamentally block a user from feeling uncomfortable or suffering a low temperature burn due to the heat generated inside the charger even though the user touches the charger 10, for example, grips a surface of the charger 10.

Figure 4:
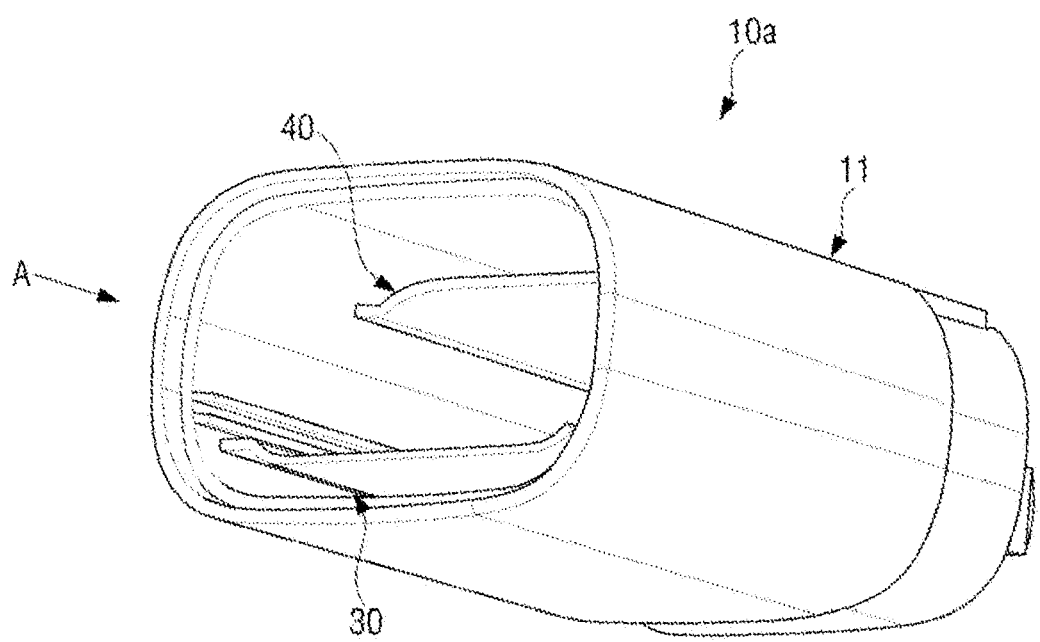
FIG. 4 is a view illustrating a heat insulating structure of the inside of a charger according to another embodiment of the disclosure.
Figure 5:
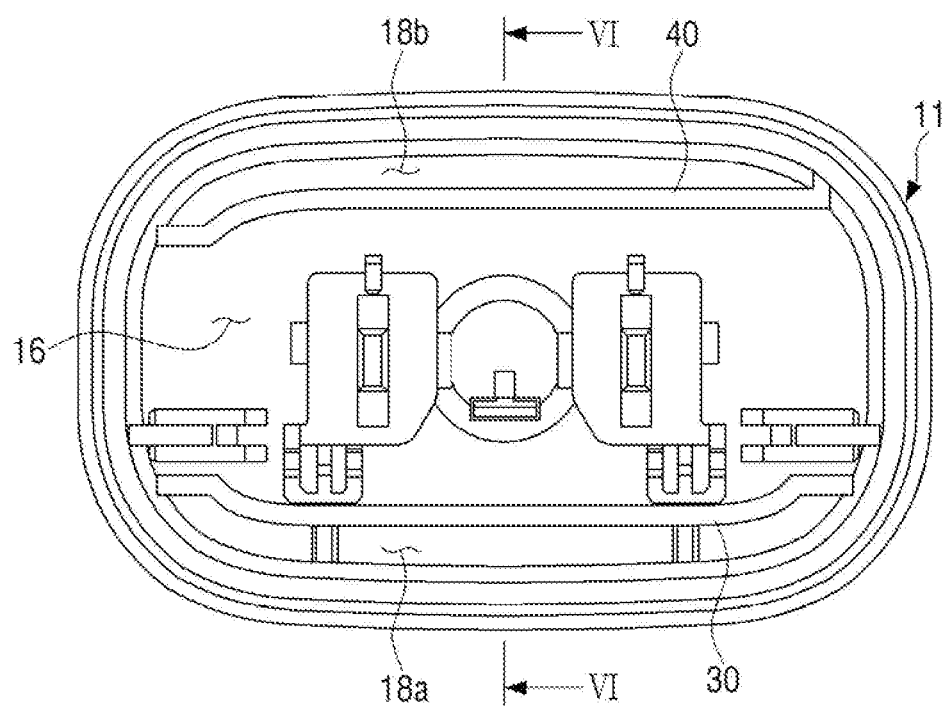
FIG. 5 is a view of the inside of the charger according to another embodiment of the disclosure when viewed in direction A illustrated in FIG. 4.
Figure 6:
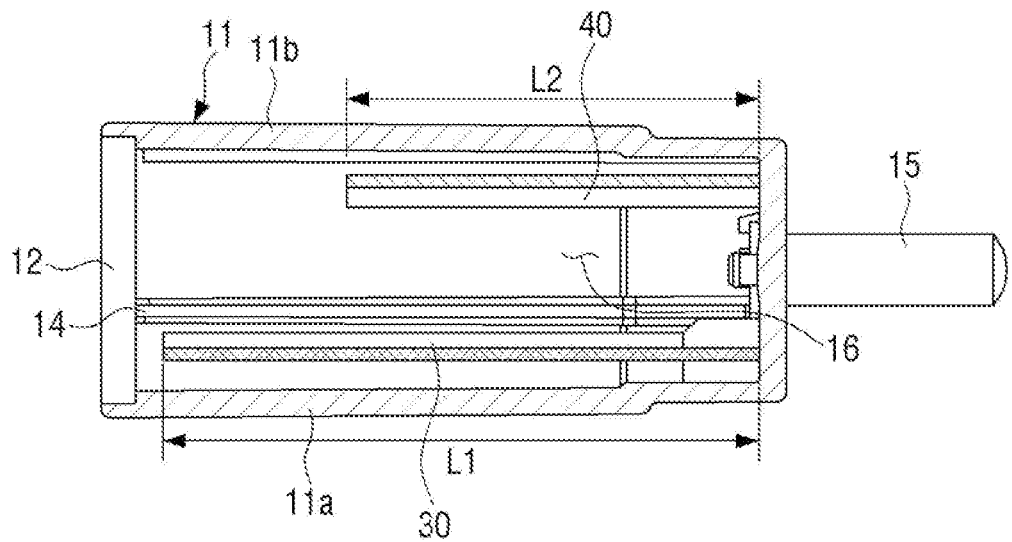
FIG. 6 is a cross-sectional view taken along line VI-VI of FIG. 5.

FIG. 4 is a view illustrating a heat insulating structure of the inside of a charger according to another embodiment of the disclosure, FIG. 5 is a view of the inside of the charger according to another embodiment of the disclosure when viewed in direction A illustrated in FIG. 4, and FIG. 6 is a cross-sectional view taken along line VI-VI of FIG. 5.

A charger 10a according to another embodiment of the disclosure may have the same configuration as that of the charger 10 described above except that it further includes an additional heat insulating member 40. Therefore, in the charger 10a according to another embodiment of the disclosure, a configuration of the additional heat insulating member 40 will be mainly described.

Referring to FIG. 5, the additional heat insulating member 40 may be formed inside the case 11 and cover various electronic components mounted on the front surface of the printed circuit board 21. Therefore, the additional heat insulating member 40 may block heat generated from the various electronic components mounted on the front surface of the printed circuit board 21 from being transferred to the other side portion 11b of the case 11.

The additional heat insulating member 40 may be injection-molded integrally with the case 11, similar to the heat insulating member 30. In addition, the additional heat insulating member 40 may be manufactured as a separate component and be coupled to an inner side of the case 11. In this case, both ends of the additional heat insulating member 40 may be coupled to the pair of slots formed in the case or the additional heat insulating member 40 may be bonded to the inner side of the case by applying an adhesive to both ends of the additional heat insulating member.

In addition, the additional heat insulating member 40 may be formed of an insulating material, similar to the heat insulating member 30.

The additional heat insulating member 40 may be disposed to be spaced apart from the other side portion 11b of the case 11 by a predetermined interval. Therefore, an additional air layer 18b may be formed between the additional heat insulating member 40 and the other side portion 11b of the case 11. The additional air layer 18b as described above may block the heat transferred from the additional heat insulating member 40 to the other side portion 11b of the case 11.

Referring to FIG. 6, a length L2 of the additional heat insulating member 40 may be smaller than a length L1 of the heat insulating member 30. This is to consider that the additional insulating member 40 does not interfere with the electronic component when the electronic component mounted on the front surface of the printed circuit board 21 is formed at a height adjacent to the other side portion 11b of the case 11.

In addition, a hole (not illustrated) through which an upper end portion of the electronic component may pass may be formed in the additional heat insulating member 40 so that the additional insulating member 40 does not interfere with the electronic component mounted on the front surface of the printed circuit board 21.

In the charger 10a according to another embodiment of the disclosure, the heat insulating member 30 and the additional heat insulating member 40 may be disposed in parallel with each other so that a compact size of the charger 10a may be maintained. In this case, the heat insulating member 30 may be disposed in parallel with one side portion 11a of the case 11, and the additional heat insulating member 40 may be disposed in parallel with the other side portion 11b of the case 11.

Figure 7:
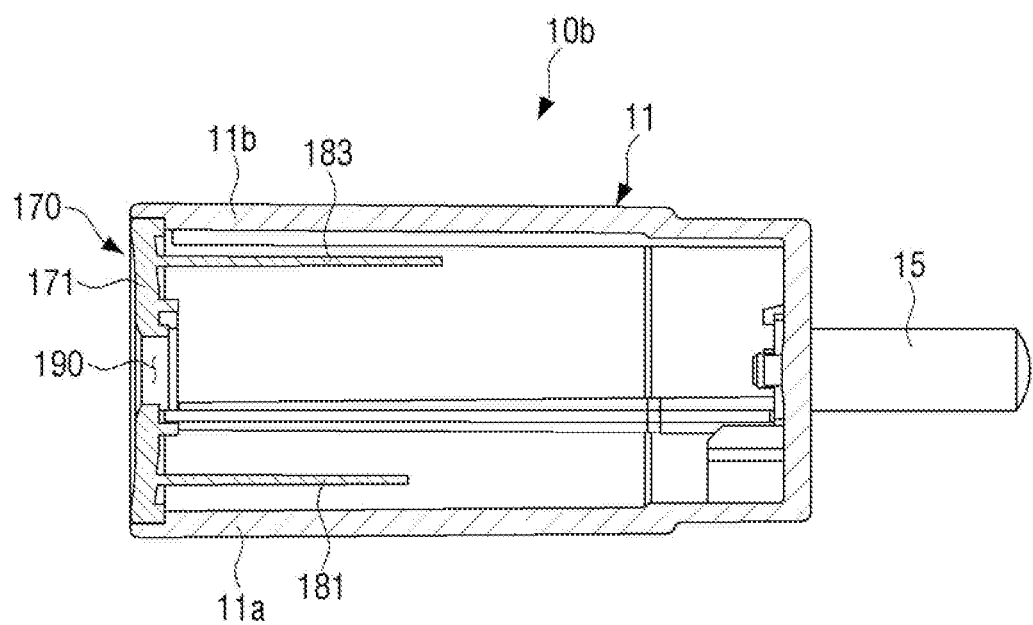
FIG. 7 is a view illustrating a heat insulating structure of the inside of a charger according to still another embodiment of the disclosure.
Figure 8:
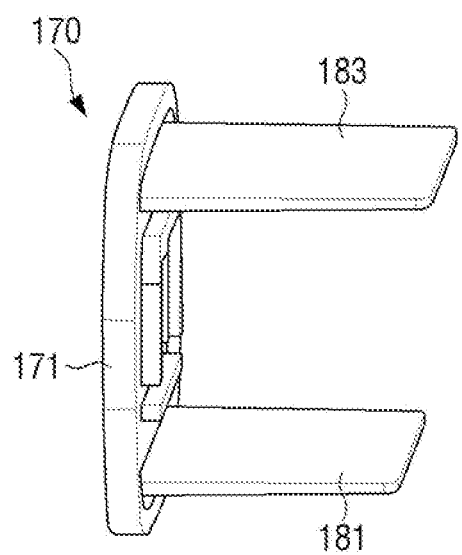
FIG. 8 is a perspective view illustrating a cover illustrated in FIG. 7.

FIG. 7 is a view illustrating a heat insulating structure of the inside of a charger according to still another embodiment of the disclosure, and FIG. 8 is a perspective view illustrating a cover illustrated in FIG. 7.

A charger 10b according to still another embodiment of the disclosure may have the same configuration as that of the charger 10a described above except that two heat insulating members 181 and 183 are formed integrally with a cover 170. Therefore, in the charger 10b according to still another embodiment of the disclosure, configurations of the cover 170 and the two heat insulating members 181 and 183 will be mainly described.

Referring to FIG. 7, first and second heat insulating members 181 and 183 may be formed on the cover 170 to protrude from one surface of a cover body 171 facing an inner side of the case 11 at the time of coupling the cover body 171 to an opening of the case 11. In this case, the first and second heat insulating members 181 and 183 may be injection-molded together with the cover body 171 or may be manufactured separately from the cover body 171 and be then each coupled to the cover body 171.

The first and second heat insulating members 181 and 183 may be formed in a thin partition wall shape, and may cover the front surface and the rear surface of the printed circuit board 21, respectively.

The first heat insulating member 181 may block heat generated from electronic components mounted on the rear surface of the printed circuit board 21 to suppress transfer of the heat to one side portion 11a of the case 11 as much as possible.

The second heat insulating member 183 may block heat generated from electronic components mounted on the front surface of the printed circuit board 21 to suppress transfer of the heat to the other side portion 11b of the case 11 as much as possible.

Meanwhile, the cover 170 is coupled to the opening 12 of the case 11 after the printed circuit board 21 is inserted into the case 11. In this case, the first and second heat insulating members 181 and 183 may be formed at lengths smaller than those of the heat insulating members described above not to interfere with the electronic components mounted on the front surface and the rear surface of the printed circuit board 21.

In FIG. 7, reference numeral 190 that is not described refers to a terminal insertion hole to which a terminal of an external cable (not illustrated) is coupled.

According to the embodiments of the disclosure as described above, the transfer of the heat generated from the electronic components of the printed circuit board disposed inside the charger to the case may be suppressed as much as possible to lower a surface temperature of the charger. Therefore, it is possible to prevent the user from feeling uncomfortable or suffering a low temperature burn due to a hot case when the user handles the charger.

Although the embodiments of the disclosure have been illustrated and described hereinabove, the disclosure is not limited to the specific embodiments described above, and may be variously modified by those skilled in the art to which the disclosure pertains without departing from the scope and spirit of the disclosure as claimed in the claims. These modifications should also be understood to fall within the technical spirit and scope of the disclosure.

What is claimed is:

1. A charger comprising:
    a case having one side at which an opening is formed and the other side to which a terminal portion is coupled;
    a printed circuit board having a front surface and a rear surface on which electronic components are mounted, respectively, and inserted into the case through the opening of the case;
    a heat insulating member disposed inside the case and formed to cover the electronic components mounted on the rear surface of the printed circuit board to block heat generated from the electronic components of the printed circuit board from being transferred to an entire surface of the case;
    a cover closing the opening of the case; and
    an additional heat insulating member disposed inside the case and covering the electronic components mounted on the front surface of the printed circuit board,
    wherein the additional heat insulating member has a shorter length than the heat insulating member, and
    wherein both of the heat insulating member and the additional heat insulating member include:
    a central portion; and
    end portions positioned at both sides of the central portion with the central portion interposed therebetween,
    the central portion being spaced farther apart from the printed circuit board than the end portions.

2. The charger as claimed in claim 1, wherein the heat insulating member is formed integrally with the case.

3. The charger as claimed in claim 1, wherein the case includes a pair of slots disposed in inner side surfaces thereof, and
    the pair of slots have grooves in which both ends of the printed circuit board are provided.

4. The charger as claimed in claim 1, wherein the heat insulating member is disposed to be spaced apart from the electronic components disposed on the rear surface of the printed circuit board.

5. The charger as claimed in claim 1, wherein the heat insulating member is disposed between the printed circuit board and one side portion of the case to be spaced apart from each of the printed circuit board and the one side portion of the case.

6. The charger as claimed in claim 1, wherein
    the central portion being recessed from the end portions toward the one side portion of the case.

7. The charger as claimed in claim 1, wherein the heat insulating member is formed of one material, and
    the heat insulating member includes an insulating material.

8. The charger as claimed in claim 1, wherein the additional heat insulating member is disposed to be spaced apart from the other side portion of the case, such that an air layer is formed between the additional heat insulating member and the other side portion of the case.

9. The charger as claimed in claim 1, wherein the additional heat insulating member is manufactured separately from the case, and ends of the additional heat insulating member are coupled to an inner side of the case.

10. The charger as claimed in claim 1, wherein the heat insulating member and the additional heat insulating member are formed of an insulator.

11. The charger as claimed in claim 1, wherein the heat insulating member and the additional heat insulating member are composed to be integrally with the cover.

* * * * *